(12) United States Patent
Wilson et al.

(10) Patent No.: US 6,644,985 B2
(45) Date of Patent: Nov. 11, 2003

(54) BALL ATTACHED ZERO INSERTION FORCE SOCKET

(75) Inventors: John W. Wilson, Phoenix, AZ (US); Rex W. Keller, Gilbert, AZ (US); Ghyath Issak, Los Gatos, CA (US)

(73) Assignee: FCI Americas Technology, Inc., Reno, NV (US)

( * ) Notice: Subject to any disclaimer, the term of this patent is extended or adjusted under 35 U.S.C. 154(b) by 17 days.

(21) Appl. No.: 09/784,919

(22) Filed: Feb. 16, 2001

(65) Prior Publication Data

US 2002/0115324 A1 Aug. 22, 2002

(51) Int. Cl.[7] ................................................. H01R 9/09
(52) U.S. Cl. ........................................................ 439/83
(58) Field of Search ................................ 439/342, 266, 439/259, 263, 264, 751, 83

(56) References Cited

U.S. PATENT DOCUMENTS

| | | | |
|---|---|---|---|
| 4,062,617 A | * 12/1977 | Johnson | |
| 4,191,440 A | * 3/1980 | Schramm | |
| 4,206,542 A | 6/1980 | Reavill | 29/877 |
| 4,274,700 A | * 6/1981 | Keglewitsch | |
| 4,420,205 A | 12/1983 | Kirkman | 339/74 R |
| 5,419,710 A | 5/1995 | Pfaff | 439/266 |
| 5,556,293 A | 9/1996 | Pfaff | 439/266 |
| 5,597,318 A | 1/1997 | Townsend | 439/342 |
| 5,597,320 A | * 1/1997 | Wang et al. | 439/342 |
| 5,685,725 A | 11/1997 | Uratsuji | 439/71 |
| 5,702,255 A | 12/1997 | Murphy et al. | 439/71 |
| 5,730,606 A | * 3/1998 | Sinclair | 439/70 |
| 5,800,194 A | * 9/1998 | Yamagishi | 439/266 |
| 6,056,576 A | * 5/2000 | Szu | 439/342 |
| 6,062,890 A | * 5/2000 | Pei et al. | 439/342 |
| 6,081,996 A | * 7/2000 | Kruppa et al. | 439/83 |
| 6,086,401 A | * 7/2000 | Hsiung et al. | 439/342 |
| 6,352,437 B1 | * 3/2002 | Tate | 439/83 |
| 6,371,784 B1 | * 4/2002 | Scholz et al. | 439/342 |

* cited by examiner

*Primary Examiner*—Neil Abrams
(74) *Attorney, Agent, or Firm*—Woodcock Washburn LLP

(57) ABSTRACT

A system and method for mechanically and electrically connecting an electronic component and a circuit substrate using a Zero Insertion Force (ZIF) socket. The ZIF socket having a plurality of press-fit contact assemblies and a housing with middle plate that is selectively movable between a contact and non-contact position. Each contact assembly being secured to the ZIF socket housing by press-fitting the lower portion of the contact assembly such that each contact assembly is anchored to an aperture in the housing bottom by compressive force. The ZIF socket is mounted to the circuit substrate and the electronic component is mounted on to the ZIF socket. The contact assemblies of the ZIF socket are selectively movable between a contact and non-contact position. The press-fit contact assemblies form a seal to prevent solder wick-up.

7 Claims, 8 Drawing Sheets

BALL ATTACHED ZERO INSERTION FORCE SOCKET

FIELD OF THE INVENTION

This invention relates generally to the field of electrical connectors, and particularly to a Zero Insertion Force (ZIF) socket for establishing a mechanical and electrical connection between an electronic component and a circuit substrate. More particularly, this invention relates to a BGA/LGA ZIF socket for connecting a processor package to a printed circuit board.

BACKGROUND FOR THE INVENTION

Electronic components, such as integrated circuits, require a large number of electrical interconnections which occupy a small space in order to communicate properly with a circuit substrate. In order to provide electrical communication between the chip and external circuitry, circuit chips are usually contained within a housing or package which supports interconnection leads, pads, and the like on one or more of its external surfaces. The contact terminals may extend from a surface of the package in the form of, for example, a pin grid array (BGA), and a land grid array (LGA). A PGA includes a plurality of pins extending from the package. A BGA includes a plurality of balls attached to a surface of the package. A BGA includes a plurality of balls attached to a surface of the package. A land grid array includes a plurality of contact pads, or lands, formed on a surface of the package. To physically secure a chip to a circuit substrate, and to provide an electrical connection between the contact terminals of the chip and corresponding traces or leads of the circuit substrate, a conductive material, such as a ball of solder, can be disposed on each contact terminal of the electronic component.

Typically, BGA devices are retained in a socket mounted on a circuit substrate, such as a printed circuit board (PCB). The socket facilitates interconnection by eliminating the need to permanently electrically connect the electronic component to the PCB. While in contact with the socket, the electronic component's contact terminals are electrically connected to the traces or leads of the PCB. Traditionally, there is an insertion force and a retention force associated with establishing or breaking the electrical connection between the electronic component and the socket.

In multiple pin electronic components, especially those having a large number of pin terminals, such as microprocessor chips, the insertion force necessary to seat the electronic component in an associated socket can be considerable and can lead to difficulty in installation of the electronic component into the socket. However, the very features of the ball grid array device which make it attractive as a device structure (e.g., closely grouped very small contacts arranged on a hidden face) make it extremely difficult to reliably mount on a PCB without damaging the BGA, the electronic component, or both. The force required to remove the component from the socket, e.g., the force required to overcome the retention force of the connection, may also be of magnitude sufficient to cause damage or even destruction of the components.

Some conventional sockets utilize zero insertion force designs which allow for easier insertion and removal of the electronic component from the socket. Zero Insertion Force (ZIF) sockets seek to maintain sufficient electrical contact for operation and testing of the electronic component while still providing a way to easily remove the electronic component from the ZIF socket and to install the electronic component onto the ZIF socket with little or no insertion force.

Traditional direct or solderless, ZIF socket systems are known wherein a ZIF socket is soldered to a PCB and the BGA package is removably attached to the ZIF socket and retained without soldering of the contact balls. Traditionally, this type of ZIF socket enables quick and easy removal, and replacement of the BGA package for repair or upgrade without soldering of the BGA adapter board. While in contact with a typical ZIF socket, an electronic component's contact terminals are electrically connected to a circuit substrate.

Traditionally, electrical contact has been established by contact fingers, extensions, or pins that are moved between a contact and a non-contact position. The contact structures that receive the BGA contact balls typically attempt to provide sufficient electrical contact and retain the ability to articulate between the contact and non-contact position many times without jeopardizing its mechanical and electrical connection properties.

Other traditional ZIF sockets use a contact structure that is biased toward a non-contact position, and a mechanism is used to selectively move the contact structure to a contact position. When the contact terminals are inserted into the contact structure and the mechanism is used to move the contact structure, the contact structure encloses, or contacts the terminals with a low insertion force. When the conventional ZIF socket is configured to be in the closed or contact position. the electronic component is electrically connected to the circuit substrate. When the conventional ZIF socket is in the non-contact position, electrical contact between the circuit substrate and the electronic component is broken.

While beneficial in larger applications, traditional ZIF designs may not be preferred in high contact density applications. Difficulties with known ZIF sockets include complexity and cost in high contact density situations, especially when miniaturization is required. Further, the contact structures of ZIF sockets may not fit within a given footprint on the PCB. When ZIF designs are used in high contact density applications, traditional ZIF sockets have not successfully maintained the contact between the electronic component and the PCB due to solder wicketing and difficulties with conventional soldering techniques. Solder wicketing occurs when solder flows into the interior of the ZIF socket by means of a path created by a contact structure. The decreased amount of solder on the exterior of the ZIF socket often leads to a deteriorated electrical connection between the ZIF socket and the PCB. Traditional ZIF sockets do not control the solder ball during reflow, and as a result, a poor connection is formed between the ZIF socket and the PCB. Therefore, a need exists for an improved ZIF socket that overcomes the drawbacks and problems associated with electrically connecting an electronic component and a circuit substrate.

SUMMARY

The present invention is directed to a Zero Insertion Force (ZIF) socket and method for mechanically and electrically connecting an electronic component to a circuit substrate using a substantially ZIF socket. The ZIF socket includes a housing that defines a cavity for containing a middle plate that is selectively movable relative to the housing between a contact and a non-contact position The housing includes a plurality of apertures formed in a top surface and arranged to correspond with the contact terminals of an electronic component that can be mounted on the top surface of the ZIF socket. The middle plate has a plurality of apertures formed therein and arranged to substantially correspond with the contact terminals of the electronic component. The housing also includes a plurality of apertures formed in a bottom surface and arranged to correspond with the leads or pads of a circuit substrate. The circuit substrate may also include a plurality of holes formed in the circuit substrate for receiving mounting projections extending from the bottom surface of the ZIF socket housing. An electrically connective medium such as, for example, a solder medium, is disposed between and mechanically and electrically connects the ZIF socket housing to the circuit substrate.

The ZIF socket includes a contact assembly that requires little or no insertion force to connect the contact terminal extending from the electronic component to the ZIF socket. The contact assembly has a lower portion and an upper portion. The lower portion is disposed within the apertures of the housing bottom and has an axial slot. The upper portion extends from the lower portion along an axis deviated from the axis of the lower portion and is flexible relative to the lower portion. The contact assembly can be held in place by inserting or press fitting the lower portion of the contact assembly into the housing bottom aperture so that the lower portion is subjected to a compressive force. When the contact assembly is disposed within the housing bottom aperture, the angle of the axial slot is urged to decrease by the aperture surface of the housing bottom. The housing bottom aperture holds the contact assembly lower portion so that the contact assembly is anchored in position by the compressive forces.

The contact assembly lower portion has a first portion with a longitudinal cross sectional shape corresponding to the shape of the housing bottom aperture and a second portion which is substantially conical in shape. The contact assembly lower portion has a recess in the second portion. The recess is adapted for receiving an electrically connective medium, such as a solder medium.

The present invention is also directed to a system and method of mechanically and electrically connecting an electronic component to a circuit substrate using a substantially zero insertion force socket. The system and method include mounting a ZIF socket on a circuit substrate wherein the ZIF socket is electrically and mechanically connected to the circuit substrate. The method further comprises mounting an electronic component to the ZIF socket wherein the electronic component is electrically connected to the ZIF socket by a contact assembly that requires little or no insertion force to connect the contact terminals extending from the electronic component to contact assemblies of the ZIF socket. Then the ZIF socket middle plate is moved to a contact position thereby deflecting the contact assembly into contact with the terminals of the electronic component. Each contact assembly is secured to the ZIF socket by press fitting the lower portion of the contact assembly into apertures of the ZIF socket housing so that the lower portion is subjected to a compressive force and is anchored in position by the apertures of the ZIF socket housing.

Preferably, the system and method further comprise operating the camming element to selectively move the contact assembly from a non-contact position, in which the plurality of apertures of the top and middle plates freely accept the contact terminals, and a closed position, in which the contact assemblies are in physical and electrical contact with the contact terminals thereby completing an electrical connection between the circuit substrate and the electronic component.

DESCRIPTION OF A PREFERRED EMBODIMENT

The present invention is directed to an apparatus, system, and method for connecting an electronic component to a circuit substrate and forming an electrical connection therebetween using a substantially zero insertion force (ZIF) socket. The present invention provides for an improved, more compliant, and more reliable connection between the ZIF socket and the circuit substrate and ultimately between the circuit substrate and the electronic component. The improved connection is formed by a press-fit contact assembly that includes a novel configuration for anchoring the contact assembly to the ZIF socket. The contact assembly is adapted to prevent and/or reduce solder wicketing during solder reflow and therefore creates a more reliable connection between the ZIF socket and the circuit substrate. In addition, the present invention provides for an improved configuration for attaching a solder medium, such as a solder ball, to the contact assembly. The present invention improves solder management and improves solder adhesion where the ZIF socket is connected to the circuit substrate.

Figure 1:
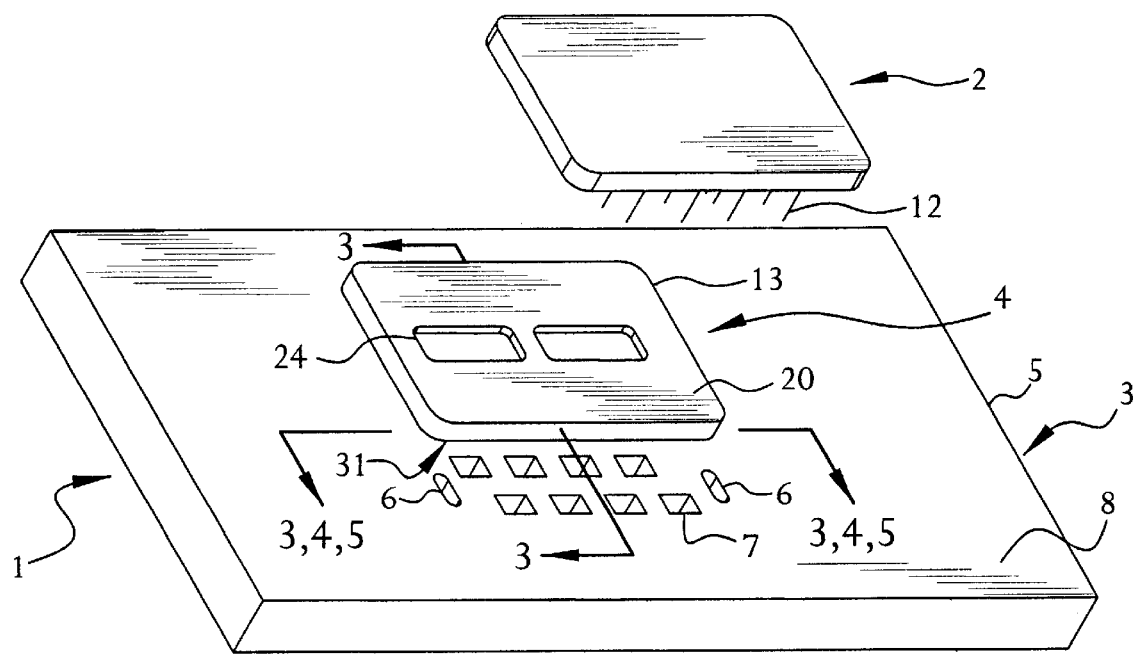
FIG. 1 is an exploded perspective view of an exemplary electrical connector system including a ZIF socket for connecting together and forming an electrical connection between an electronic component and a printed circuit board in accordance with the present invention.
Figure 1A:
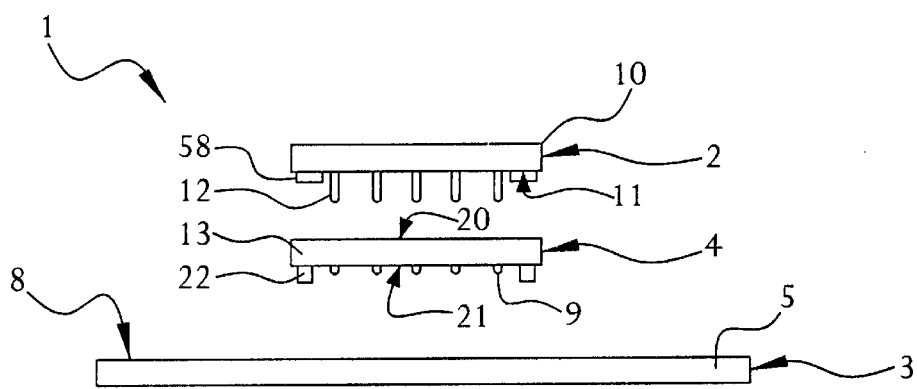
FIG. 1A is an exploded side view of the electrical connector system of FIG. 1.

FIG. 1 and FIG. 1A show an exemplary electrical connector system for mechanically and electrically connecting an electronic component 2 to a circuit substrate 3 using a ZIF socket 4. As shown in FIG. 1 and 1A, the ZIF socket 4 is disposed between and connects the electronic component 2 to the circuit substrate 3.

As shown in FIGS. 1 and 1A, the circuit substrate 3 includes a board body 5 having a plurality of recesses 6 for locating and holding the ZIF socket 4 thereon. The circuit substrate 3 also includes a plurality of electrically conductive contact structures 7 formed on a top mounting surface 8 of the circuit substrate 3. The plurality of conductive contact structures 7 are adapted for receiving an electrical attachment medium 9 disposed thereon for establishing an electrical connection between ZIF socket 4 and circuit substrate 3. The conductive contact structures 7 are adapted for completing an electrical path between the ZIF socket 4 and the circuit substrate 3. The conductive contact structures 7 are preferably conventional contact pads, traces, or the like. Preferably, the circuit substrate 3 is a conventional printed circuit board (PCB) made from conventional non conductive materials. The conductive contact structures 7 are preferably formed from an electrically conductive material, such as a copper material.

As shown in FIG. 1 and FIG. 1A, the electronic component 2 includes a housing 10 having a bottom mounting surface 11. The electronic component 2 has a plurality of contact terminals 12 that pass through respective openings (not shown) formed in the bottom mounting surface 11. The plurality of contact terminals 12 are adapted to extend from the bottom mounting surface 11 to facilitate electrical and mechanical contact with the ZIF socket 4. The contact terminals 12 are made of an electrically conductive material, preferably a copper material. In one embodiment, the electronic component 2 is a processor package, such as for example, the Intel Merced processor package.

Figure 2:
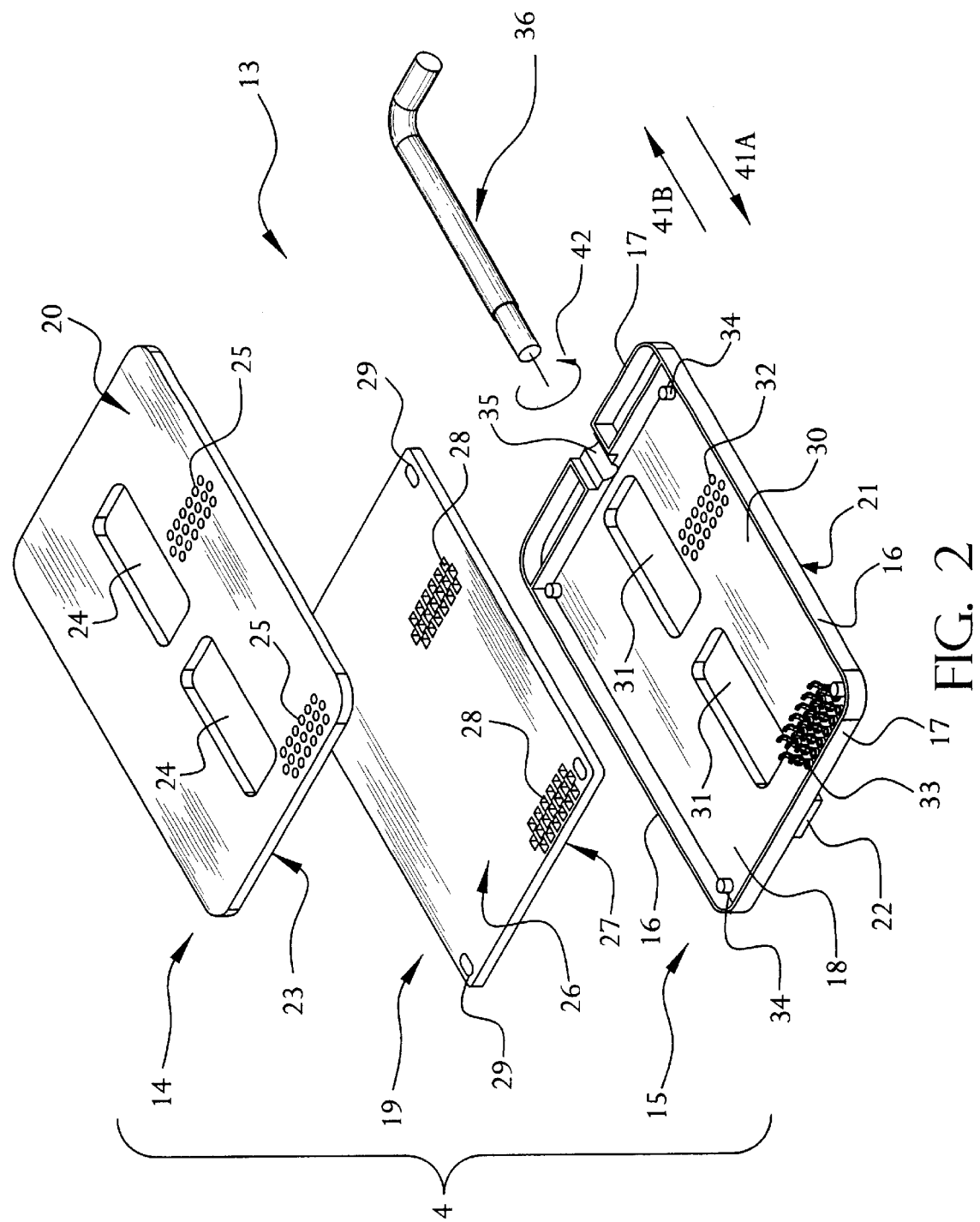
FIG. 2 is an exploded perspective view of the ZIF socket of FIG. 1.

FIG. 2 shows an exploded view of the exemplary ZIF socket 4. As shown in FIG. 2, the ZIF socket 4 includes a housing 13 having a top 14, a bottom 15, two side walls 16, and two end walls 17. The ZIF socket housing 13 defines a cavity 18 wherein a middle plate 19 is disposed and is preferably rectangular in shape. The ZIF socket housing 13 includes a top mounting surface 20 and a bottom mounting surface 21. The ZIF socket 4 also includes one or more mounting projections 22 extending downward from the bottom mounting surface 21. The mounting projections 22 are adapted for insertion into corresponding recesses 6 formed in the circuit substrate 3 for mechanically locating and holding the ZIF socket 4 to the circuit substrate 3. Preferably, at least two mounting projections 22 are used, one at each end of the ZIF socket housing 13.

As shown in FIG. 2, the housing top 14 includes an interior face 23 and preferably has one or more openings 24 that extend through the housing top 14 from the housing top mounting surface 20 to the housing top interior face 23. The housing top 14 includes a plurality of apertures 25 formed therein that extend through the housing top 14 from the housing top mounting surface 20 to the housing top interior face 23. The middle plate 16 includes a top face 26 and a bottom face 27. The middle plate also includes a plurality of apertures 28 that extend through the middle plate 16 from the top face 26 to the bottom face 27. The middle plate 16 also includes a plurality of elongated apertures 29 that extend through the middle plate 16 from the top surface 26 to the bottom face 27. The housing bottom 15 includes an interior face 30 and preferably has one or more openings 31 that extend through the housing bottom 15 from the housing bottom mounting surface 21 to the housing bottom interior face 30. The housing bottom 15 includes a plurality of apertures 32 that extend through the housing bottom 15 from the bottom mounting surface 21 to the bottom interior face 30. The housing bottom 15 includes a plurality of contact assemblies 33 disposed within the housing bottom plurality of apertures 32. The housing bottom 15 also includes a plurality of protrusions 34 that extend upward from the housing bottom interior face 30. The plurality of protrusions 34 of the housing bottom 15 are adapted to contact the housing top 14 to facilitate the coupling of the housing top 14 to the housing bottom 15. Preferably the plurality of protrusions 34 extend through and do not contact a plurality of elongated apertures 29 in the middle plate 19. Preferably, the housing bottom 15 is composed of an insulative material, preferably manufactured from plastic, such as a liquid crystal polymer (LCP). As shown in FIG. 2, the housing bottom 15 also includes a groove 35 adapted for receiving a camming element 36 which extends from the outside of the ZIF socket 4 into cavity 18. The groove 35 assists in operating the camming element 30 by restricting extraneous movement by the camming element 36 relative to the ZIF socket housing 13.

The plurality of apertures 25 of the housing top 14 and plurality of apertures 28 of the middle plate 16 are arranged to correspond with a plurality of contact terminals 12 of electronic component 2. The plurality of apertures 32 of the housing bottom 15 are arranged to correspond with a plurality of electrically conductive contact structures 7 on the circuit substrate 3. In one embodiment of the ZIF socket housing 13 the plurality of apertures 32 of the housing bottom correspond with the plurality of contact terminals 12 of the electronic component. In one embodiment of the housing top 14 there are four hundred and eighteen apertures 25 divided into two groups of two hundred and nine.

As shown in FIG. 2, the housing bottom 15 can include two side walls 16 and two end walls 17 that extend upwardly around the outer edge of the housing bottom 15 toward the housing top 14 to facilitate the coupling oft the housing bottom 15 to the housing top 14. The side walls 16 and end walls 17 form cavity 18 between the housing top 14 and housing bottom 15 for receiving and holding the middle plate 16 therebetween. Alternatively, the sidewalls 16 and end walls 17 can extend down from the housing top 14, or a portion of the side walls 16 and end walls 17 can extend up from the housing bottom 15 and a portion of the side walls 16 and end walls 17 can extend down from the housing top 14. The housing top 14 and housing bottom 15 are coupled together about the middle plate 19 to hold the middle plate 19 therebetween. The middle plate 19 moves independently of the housing top 14 and housing bottom 15 which are both stationary.

Figure 3:
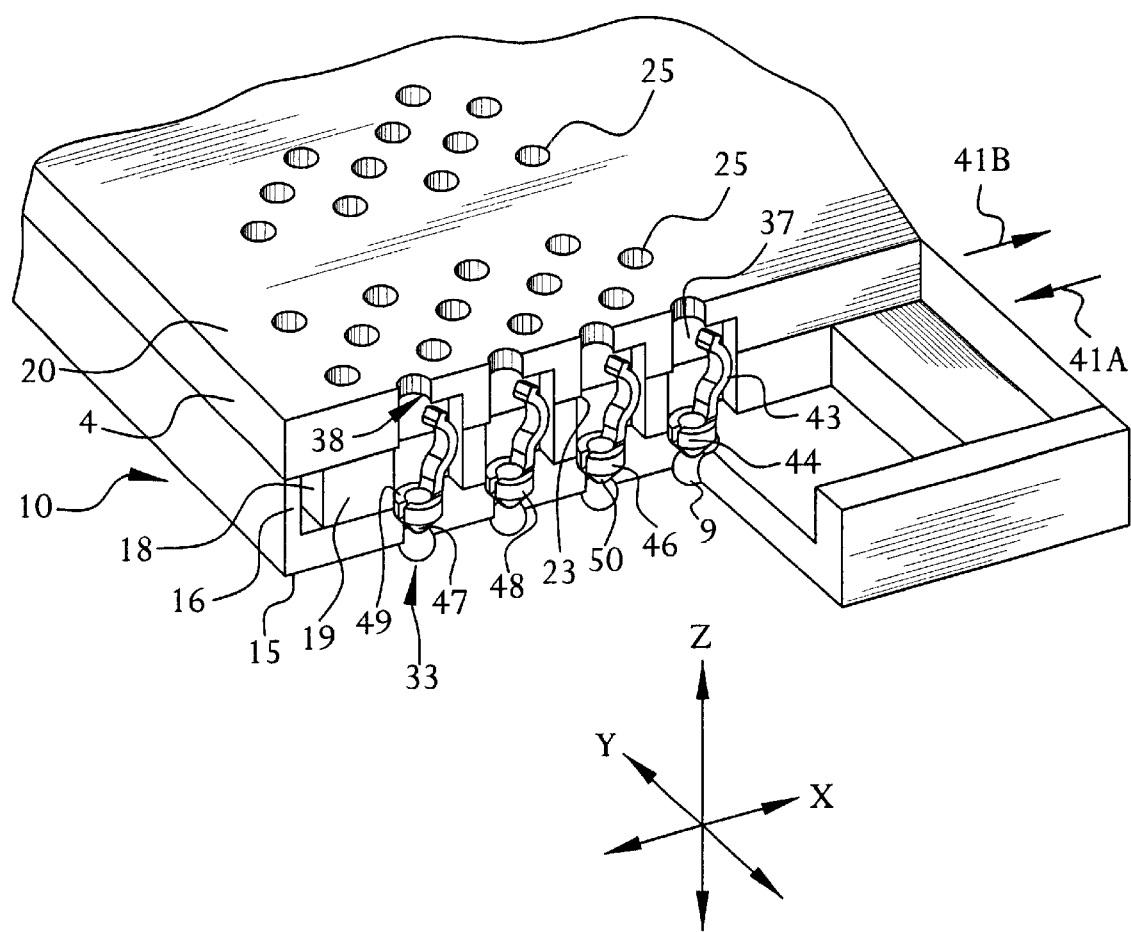
FIG. 3 is a cut-a-way perspective view of the ZIF socket of FIG. 1 showing exemplary contact assemblies positioned in the ZIF socket housing.

FIG. 3 shows a cut-a-way perspective view of the ZIF socket 4. As shown in FIG. 3, the ZIF socket 4 includes a plurality of recesses 37 formed on the housing top interior face 23 that correspond with the housing top plurality of apertures 25. Each housing top aperture 25 has a recess 37 on the interior face 23 of the housing top 14 adapted for receiving a portion of a contact assembly 33 and a contact terminal 12. Each recess 37 has a recess face 38. Each housing top aperture 25 preferable has a circular cross sectional shape, but may include other shapes which preferably correspond to the cross sectional shape of the contact terminal 12. Each housing top recess 37 preferably, but not necessarily, has a rectangular cross sectional shape. The cross sectional shape of the housing top recess 37 may also include other shapes, such as a square, other polygonal shape, oval, other non-polygonal shape, etc. that allows the housing top recess 37 to receive a contact terminal 12 and a portion of a contact assembly 33. The housing top 14 is composed of an insulative material, preferably manufactured from plastic, such as for example a liquid crystal polymer (LCP).

Figure 4:
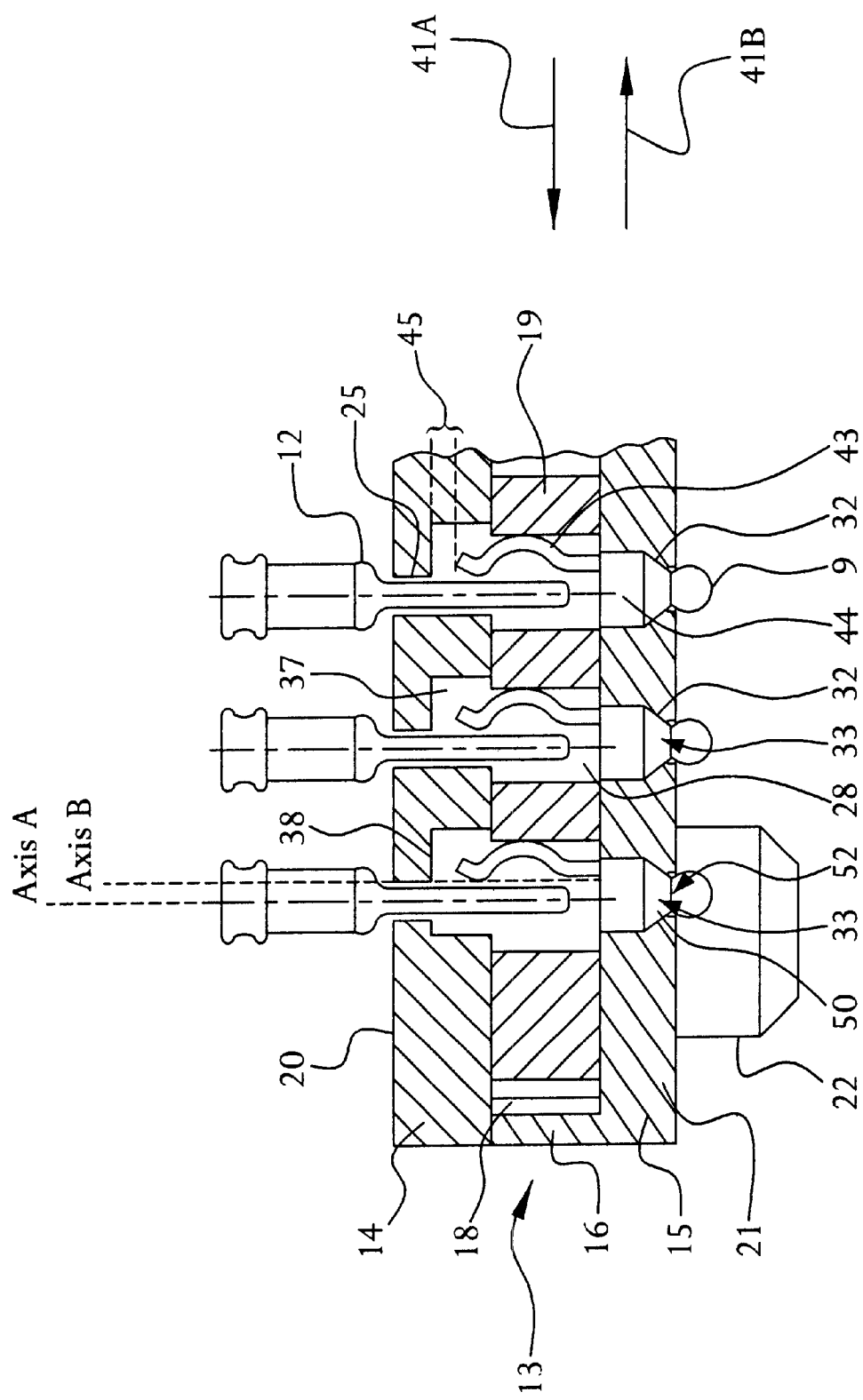
FIG. 4 is a partial cross sectional view of the ZIF socket of FIG. 1 showing the contact assemblies and the electronic component contact terminals in the non-contact position.

FIG. 4 shows a partial cross sectional view of the ZIF socket 4. As shown in FIG. 3 and FIG. 4, the housing bottom 15 includes a plurality of apertures 32 preferably adapted to receive a plurality of contact assemblies 33. The cross sectional shape of each housing bottom aperture 32 corresponds to the cross sectional shape of one contact assembly 33. As shown, each housing bottom aperture 32 preferable has a circular cross sectional shape, but may include other shapes which preferably correspond to the cross sectional shape of the contact assembly 33 (e.g. square, rectangle, other polygonal shape, oval, or other non-polygonal shape).

As shown in FIG. 3 and FIG. 4, a plurality of contact assemblies 33 are disposed in the housing bottom within a plurality of apertures 32. As shown, the contact assemblies 33 extend upward from the housing bottom 15 and extend through the middle plate 19 and at least some distance into the housing top recess 37. Each contact assembly 33 is oriented generally perpendicular to the surface of the housing top 14. middle plate 19, and housing bottom 15. Each contact assembly 33 is coupled to the housing bottom 15 and arranged to form an electrical connection between the plurality of contact terminals 12 of the electronic component 2 and the contact structures 7 of the circuit substrate 3. The contact assembly is made from an electrically conductive material.

Figure 5:
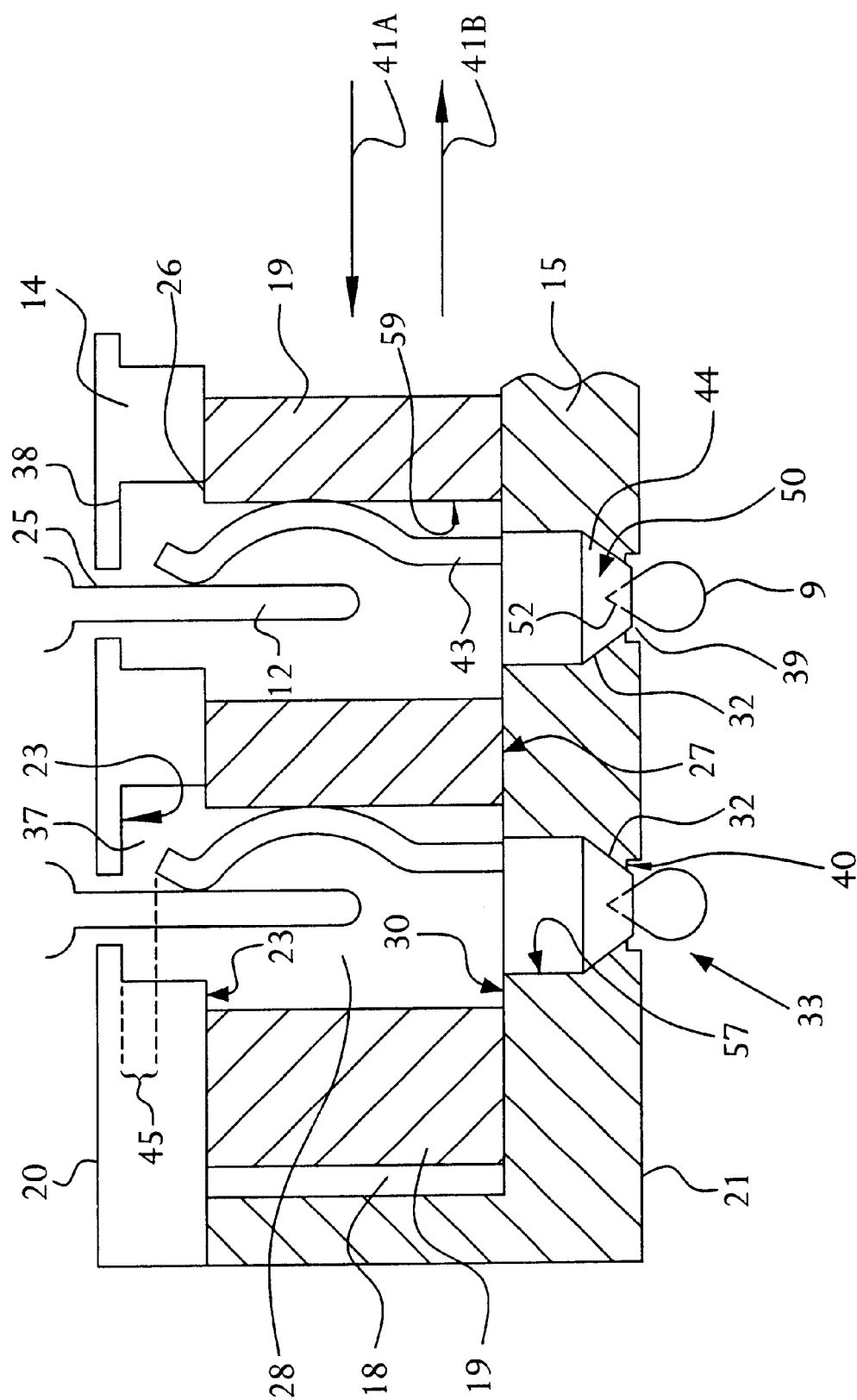
FIG. 5 is a partial cross sectional view of the ZIF socket of FIG. 1 showing the contact assemblies and the electronic component contact terminals in the contact position.

FIG. 5 shows a partial cross sectional view of the ZIF socket 4. As shown in FIG. 5, the housing bottom 15 has a plurality of recesses 39 formed in the bottom mounting surface 21 that correspond with the plurality of apertures 32 of the housing bottom 15. Each housing bottom recess 39 preferably has a rectangular cross sectional shape, but the cross sectional shape may also include other shapes such as for example, a square, other polygonal shape, oval, other non-polygonal shape, etc. As shown in FIG. 5, each housing bottom recess 39 has an exterior face 40. An electrical attachment medium 9, such as a mass of fusible material like a solder ball, resides, at least partially, within each housing bottom recess 39. The electrical attachment medium 9 is used to connect the ZIF socket 4 to the circuit and substrate 3 using conventional, reflow, or soldering techniques.

As shown in FIG. 3, FIG. 4, and FIG. 5, the middle plate plurality of apertures 28 are adapted for receiving the a portion of a contact assembly 33 and a contact terminal 12. The middle plate plurality of apertures 28 are preferably formed as elongated slots with a cross sectional shape of a rectangle, but could include other shapes that allow the plurality of apertures 28 to enclose a contact terminal 12 and a portion of a contact assembly 33. Preferably, the middle plate 19 is composed of an insulative material manufactured from plastic, such as liquid crystal polymer (LCP).

As shown in FIG. 2, the plurality of elongated apertures 29 of the middle plate 19 are adapted to receive the plurality of protrusions 34 extending from the housing bottom 15. The plurality of elongated apertures 29 have a cross sectional shape of an oval, or elongated slot. In this manner, the plurality of protrusions 34 help stabilize the middle plate 19 by restricting extraneous movement (e.g., side to side) of the middle plate 19 relative to the ZIF socket housing 13 while still allowing the middle plate 19 to move (e.g., end to end) as shown in FIG. 4 and 5 by directional arrows 41A and 41B.

Referring to FIG. 2 and 3, the middle plate 19 moves relative to the ZIF socket housing 13 indicated by directional arrows 41A and 41B when the camming element 36 is operated. Operation of the camming element 36 moves the middle plate 19 selectively between a contact and non-contact position. In the contact position as shown in FIG. 5, the ZIF socket 4 mechanically and electrically connects the electronic component 2 to the ZIF socket 4. In the non-contact position as shown in FIG. 4, the ZIF socket 4 is not electrically connected to the electronic component 2. The middle plate 19 movement is preferably along the x-axis as indicated in FIGS. 3, 4 and 5 by directional arrows 41A and 41B. In alternative embodiments movement of middle plate 15 may occur along the y-axis, z-axis, or other movement which would selectively establish contact between the plurality of contact assemblies 33 and the plurality of contact terminals 12.

The camming element 36 is operatively coupled to the ZIF socket housing 13 to enable selective movement of the middle plate 19 between the contact position, as shown in FIG. 5, and a non-contact position as shown in FIG. 4. As shown, the camming element 36 includes a handle having an L-shape. Operation of the camming element 36 is preferably accomplished by rotating the camming element 36 about its axis, i.e. around the x-axis as shown by direction of arrow 42 of FIG. 2. Operation of the camming element 36 in alternate embodiments could, however, encompass additional methods including but not limited to longitudinal movement, movement selectively perpendicular to the ZIF socket housing 13 or any movement selectively placing the plurality of contact assemblies 33 in electrical contact with the plurality of contact terminals 12.

Preferably, contact assemblies 33 are stamped and formed from a sheet of conductive materials. However, other methods (such as machining) could be used.

Referring to FIGS. 6A through 6E, each contact assembly 33 includes an upper portion 43 and lower portion 44. The upper portion 43 extends upward from the contact assembly lower portion 44. As shown, the contact assembly upper portion 43 is preferably a sickle shaped wiping arm. The axis of the contact assembly upper portion 43, Axis B, is preferably offset from the axis of the contact assembly lower portion 44, Axis A. The upper portion 43 may include other shapes, such as straight flat wiping arms, wiping arms with a bulbous or enlarged head, round pins, or other wiping arm shape which facilitates contact with the contact terminals 33. In addition, the contact assembly 33 can include several different types of contacts at one time. For example, some contacts could carry a signal or ground, while others carry power, thereby allowing the connectors of the present invention to be hot matable.

As shown in FIG. 3, FIG. 4, and FIG. 5, each contact assembly upper portion 43 extends through the middle plate aperture 28 and substantially through the housing top recess 37 on the interior face 23 of the housing top 14. As shown in FIG. 4 and FIG. 5, a gap 45 is created between each contact assembly upper portion 43 and the recess face 38 of each housing top recess 37.

FIG. 4 shows the plurality of contact assemblies 33 and the plurality of contact terminals 12 in the non-contact position where each contact assembly 33 is separate from each contact terminal 12, or unmated. In the non-contact position the contact assembly upper portion 43 is in the rest position. In the non-contact position, the contact assembly upper portion 43, in the rest position, is biased away from the axis of the contact assembly lower portion 44, Axis A, so that there is no electrical contact with the contact terminal 12. As shown in FIG. 4, in the non-contact position, Axis B is parallel to the axis of Axis A.

In the contact position, as shown in FIG. 5, each contact assembly upper portion 43 of the plurality of contact assemblies 33 is urged toward each contact terminal 12 of the plurality of contact terminals by the middle plate 19 until the upper portion 43 is in contact with a contact terminal 12. The upper portion 43 is subjected to a bending moment by the middle plate 19. Specifically, operation of the camming element 36 moves the middle plate 19 in the direction of arrow 41A so that each contact assembly upper portion 43 is contact and urged by each aperture interior face 59 of the middle plate plurality of apertures 28. When subjected to the bending moment by the middle plate 19, Axis B, is not parallel to Axis A.

Figure 6A:
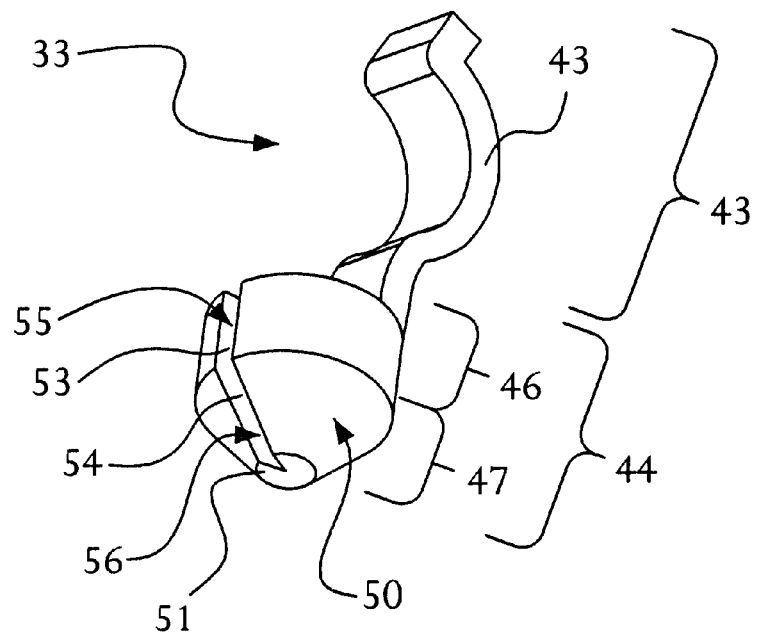
FIG. 6A is a bottom perspective view of an exemplary contact assembly of FIG. 3.
Figure 6B:
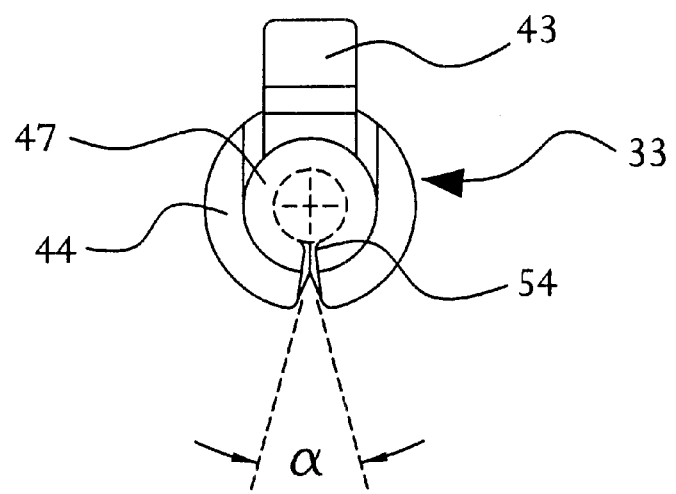
FIG. 6B is a top view of the contact assembly of FIG. 6A.
Figure 6C:
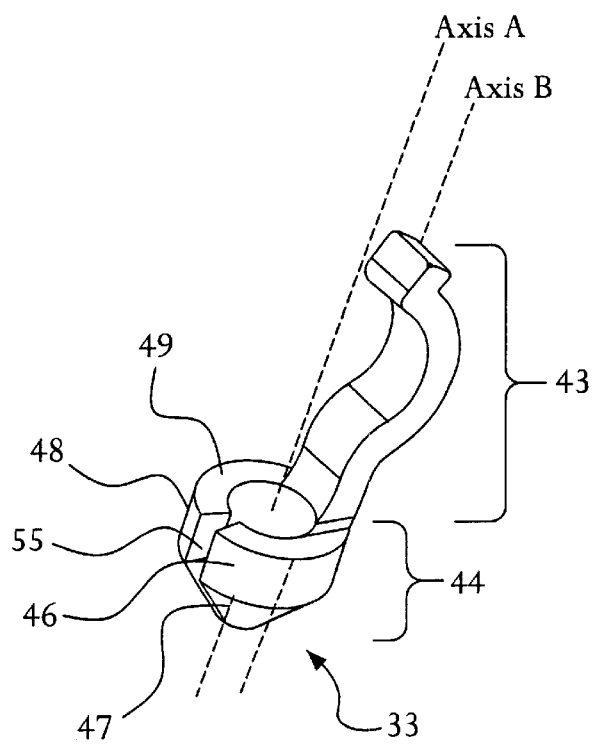
FIG. 6C is a top perspective view of the contact assembly of FIG. 6A.
Figure 6D:
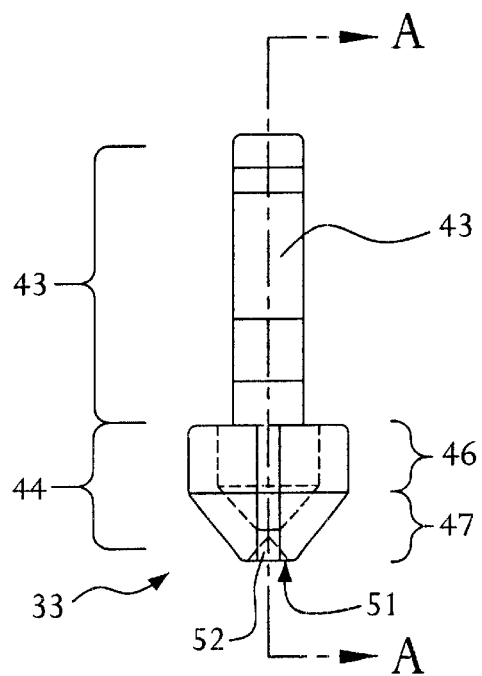
FIG. 6D is a front view of the contact assembly of FIG. 6A.
Figure 6E:
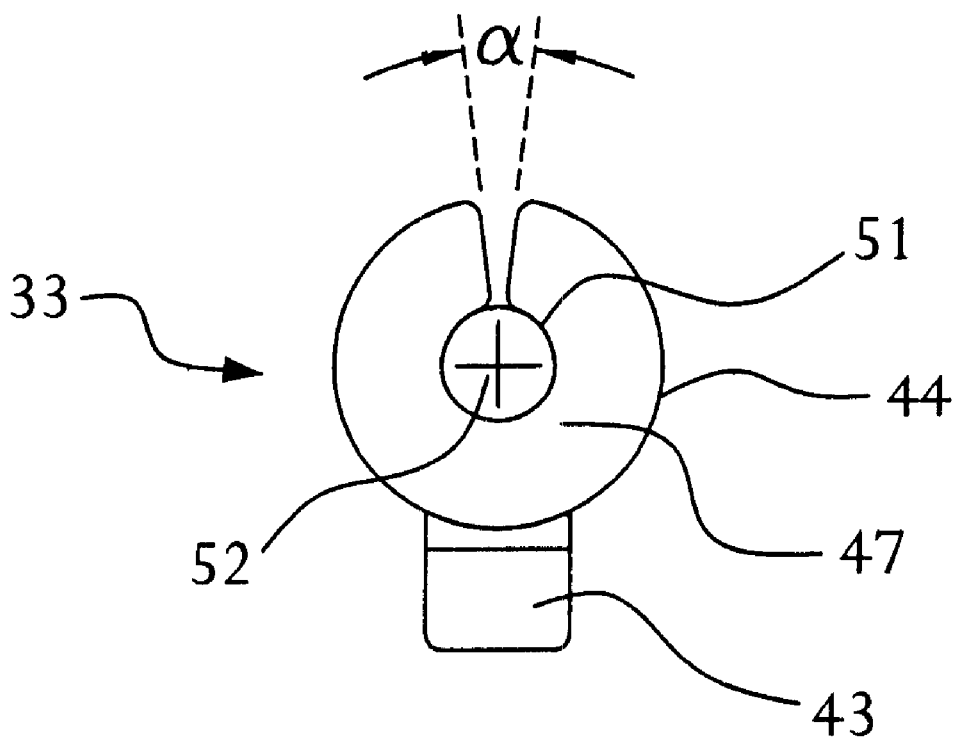
FIG. 6E is a bottom view of the contact assembly of FIG. 6A.

As shown in FIGS. 6A through 6E, the contact assembly lower portion 44 has a first portion 46 and a second portion 47. The cross sectional shape of the first portion 46 is preferably circular, but may also include any suitable shape that allows compressive forces to hold the contact assembly 33 in position such as a square, other polygonal shape or other non-polygonal shape. The first portion 46 has a longitudinal cross sectional shape corresponding to the shape of the housing bottom plurality of apertures 32. The perimeter of the cross sectional shape of the first portion 46 is preferably slightly greater than the perimeter of the cross sectional shape of the housing bottom plurality of apertures 32. The first portion 46 has an exterior surface 48 and a top surface 49, as shown in FIG. 6C.

The second portion 47 of contact assembly lower portion 44 has a substantially conical shape and corresponds at its upper end to the cross sectional shape of the first portion 46. The cross sectional shape of the second portion 47 is preferably circular, but may also include a square shape, other polygonal shape, or other non-polygonal shape that corresponds with the cross sectional shape of the first portion 46. The perimeter of the cross sectional shape of the second portion 47 is preferably slightly greater than the perimeter of the cross sectional shape of the housing bottom plurality of apertures 32. The second portion 47 has an exterior surface 50 and a bottom surface 51. The bottom surface 51 of the second portion 47 may be planar or conical, but preferably includes a recess 52 adapted for receiving the electrical attachment medium 9.

The second portion recess 52 of the contact assembly 33 is adapted to improve the connection between the ZIF socket 4 and the circuit substrate 3 by securing the electrical attachment medium 9 to the plurality of contact assemblies 33. The second portion recess 52 of each contact assembly 33 improves solder management by anchoring the electrical attachment medium 9 in position and improves solder adhesion by providing increased surface area of the contact assembly 33 that can be connected to the solder medium.

The first portion 46 has an axial slot 53 that allows slight deformation of shape due to compressive forces. The second portion 47 has an axial slot 54 that allows slight deformation of shape due to compressive forces and corresponds to the first portion axial slot 53. The walls 55 of axial slot 53 preferably create an angle, $\alpha$, of about 13 degrees. The walls 56 of axial slot 54 also preferably create an angle, $\alpha$, of about 13 degrees.

Axial slot 53 and axial slot 54 are adapted to secure the contact assembly 33 to the ZIF socket 4 by press fitting the contact assembly 33 into the ZIF socket housing 13. The housing bottom aperture 32 holds the contact assembly lower portion 44 so that the contact assembly 33 is anchored in position by compressive forces. When the contact assembly lower portion 44 is disposed within the housing bottom aperture 32, the axial slot is subjected to compressive forces such that angle, $\alpha$, decreases to substantially zero. Specifically, the first portion exterior surface 48 of each contact assembly 33 is urged by the housing bottom aperture surface 57 of the housing bottom plurality of apertures 32 so that the lower portion 44 is subjected to compressive forces. When the lower portion 44 is disposed within the housing bottom aperture 32, the perimeter of the cross section shape of the first portion 46 is equal to the perimeter of the cross sectional shape of the housing bottom aperture 32. When the lower portion 44 is disposed within the housing bottom aperture 32, the tope surface 49 is flush with the housing interior surface 30. Preferably, when the lower portion 44 is disposed within the housing bottom aperture 32, the second portion bottom surface 51 is preferably flush with the recess exterior face 40. However, it may also protrude slightly into the housing bottom recess 39. The contact assembly 33 is made from an electrically conductive material such as, for example, a copper material.

The compressive press fit connection of the contact assembly 33 seals the ZIF socket 4 so that solder wicketing is prevented and/or reduced during solder reflow. The compressive press fit connection of the contact assembly 33 reduces or eliminates pathways for solder to enter the ZIF socket cavity 18 during soldering and therefore creates a more reliable mechanical and electrical connection between the ZIF socket 4 and the circuit substrate 3.

Referring back to FIG. 1 and FIG. 2, the ZIF socket 4 is electrically and mechanically connected to the circuit substrate 3. The ZIF socket 4 is secured to circuit substrate 3 by mechanically coupling the ZIF socket housing 13 to the circuit substrate 3. Preferably, the ZIF socket 4 is mechanically coupled to the circuit substrate 3 by disposing the housing mounting projections 22 within the circuit substrate plurality of recesses 6. The mounting projections 22 are then secured to the circuit substrate 3 using conventional techniques, such as press fit techniques.

Referring back to FIG. 4 and FIG. 5, the ZIF socket 4 is electrically coupled to the circuit substrate 3 by securing the electrical attachment medium 9 to the second portion 47 of the contact assembly 33. Preferably, the electrical attachment medium 9 is disposed within the second portion recess 52 of the contact assembly 33 and electrically connected to the second portion 47 using conventional techniques such as Ball Grid Array technology, reflow or soldering techniques. The ZIF socket 4 with connected electrical attachment medium 9 is then electrically connected to the circuit substrate 3 by electrically connecting the electrical attachment medium 9 to each of the plurality of electrically conductive contact structures 7 formed on the top mounting surface 8 of the circuit substrate 3. The electrical attachment medium 9 is connected to the electrically conductive contact structures 7 using convention techniques, such as Ball Grid Array technology, reflow soldering techniques or the like.

Referring back to FIG. 1 and FIG. 1A, the ZIF socket 4 is electrically and mechanically connected to the electronic component 2. The electronic component 2 is mechanically coupled to the ZIF socket 4 by disposing the electronic component bottom mounting surface 11 on the ZIF socket housing top surface 20. In an alternative embodiment, the electronic component mounting projections 58 may extend down from the electronic component bottom mounting surface 11 to physically contact the ZIF socket housing top surface 20. The electronic component mounting projections 58 are then secured to the ZIF socket housing 13 using conventional techniques, such as press fit techniques. Alternatively, the electronic component mounting projections 58 may extend upward from the ZIF socket housing top surface 20 to physically contact electronic component bottom mounting surface 11. In this embodiment of the present invention the electronic component mounting projections 58 are then secured to the electronic component bottom mounting surface 11 using conventional techniques, such as press fit techniques.

As shown in FIG. 4 and FIG. 5, when the electronic component 2 is disposed upon the ZIF socket housing 13, a plurality of contact terminals 12 enter the plurality of apertures 25 uninhibited by an insertion force. The plurality of contact terminals 12 extend through the plurality of apertures 25 in the ZIF socket housing 13 and substantially through the middle plate plurality of apertures 28. The electronic component 2 is then electrically coupled to the ZIF socket 4 by operating the camming element 36. The camming element 36 is operated to mechanically connect the plurality of contact terminals 12 and the upper portion 43 of each of the plurality of contact assemblies 33 thereby creating an electrical connection between the ZIF socket 4 and the electronic component 2.

The present ZIF socket 4 is important because it allows for the easy connection of the electronic component 2 to the circuit substrate 3 without risk of damaging the electronic component 2. Risk of damage during connection is minimized because zero or substantially no insertion force is associated with connecting the electronic component 2 and the ZIF socket 4. The ZIF socket 4 also allows for the easy removal of the electronic component 2 without risk of damaging the electronic component 2 or the ZIF socket 4. Risk of damage during removal is minimized because there is no retention force associated with the removal. The ease of connection and removal make the ZIF socket 4 ideal for upgrading or replacing the electronic component 2 and for the testing of electronic components 3.

Referring to FIG. 1 and FIG. 1A, the present invention also encompasses a method of establishing an electrical connection between a circuit substrate 3 and an electronic component 2 by utilizing the ZIF socket 4. An electrical connection is made between a circuit substrate 3 and the ZIF socket 4 by securing the electrical attachment medium 9 to the second portion 47 of the contact assembly 33. Specifically, the electrical attachment medium 9 is disposed within the second portion recess 52 and electrically connected to the second portion recess 52 using conventional techniques, such as Ball Grid Array technology, reflow, or soldering techniques. The ZIF socket 4 is then mechanically and electrically connected to the circuit substrate 3 by electrically connecting the electrical attachment medium 9 to the circuit substrate 3 using convention techniques, such as Ball Grid Array technology, reflow, or soldering techniques.

An electrical connection is also made between an electronic component 2 and the ZIF socket 4 by disposing the plurality of contact terminals 12 within the plurality of apertures 25. The plurality of contact terminals 12 of the electronic component 2 enter the plurality of apertures 25 uninhibited by an insertion force. The plurality of contact terminals 12 extend through the plurality of apertures 25 in the ZIF socket housing 13 and substantially through the middle plate plurality of apertures 28. Then, camming element 36 is operated thereby causing the middle plate aperture interior face 59 to urge the contact element upper portion 43 to mechanically and electrically contact the contact terminals 12, as shown in FIG. 5. Thus, an electrical pathway is created between the circuit substrate 3 and the electronic component 2 by the ZIF socket 4 by electrically coupling the circuit substrate 3 to the ZIF socket 4 and electrically coupling the electronic component 2 to the ZIF socket 4.

The electronic component 2 is disengaged from the ZIF socket 4 by operating the camming element 36 thereby causing the middle plate 19 to move from the contact position to the non-contact position. Operation of the camming element 36 moves the middle plate 19 away from the contact assembly upper portion 43 in the direction of arrow 41B. In the non-contact position, the contact assembly upper portion 43 is biased away from the contact terminals 12 of the electronic component 2 so that no electrical contact is maintained between the circuit substrate 3 and the electronic component 2. The electronic component 2 is then removed from the ZIF socket 4 by mechanically separating the electronic component 2 from the ZIF socket 4 by causing the contact terminals 33 of the electronic component 2 to withdraw from the plurality of apertures 25. Withdrawal of the contact terminals 33 from the plurality of apertures 25 is accomplished without having to overcome a significant retention force.

Those skilled in the art will appreciate that numerous changes and modifications may be made to the preferred embodiments of the invention and that such changes and modifications may be made without departing from the spirit of the invention. For example, it should be understood that the contact assembly upper portion can take many shapes to facilitate the mechanical connection between the contact assembly and the contact terminals, and that the push-pin contact assembly shape could take many forms and sizes, and that the axial slot that facilitates the push-in design may vary in shape and size. It should also be understood that the contact assembly second portion recess may vary in shape, depth, and size to facilitate increased solder adhesion and better solder management. It is therefore intended that the appended claims cover all such equivalent variations as fall within the true spirit and scope of the invention.

What is claimed:

1. A socket for selectively, mechanically and electrically connecting an electronic component to a circuit substrate, said socket comprising:

a housing comprising a top mounting surface and bottom mounting surface, said top mounting surface having a plurality of apertures therein arranged to correspond with a plurality of contact terminals extending from said electronic component, and said bottom mounting surface having a plurality of apertures arranged to correspond with electrically conductive contacts of said circuit substrate;

a cavity formed by said housing between said top mounting surface and said bottom mounting surface;

a middle plate disposed in said cavity, said middle plate selectively movable relative to the housing between a contact and non-contact position, said plate having a plurality of apertures arranged to correspond with and receive said plurality of contact terminals of said electronic component;

a plurality of contact assemblies disposed in said apertures of said housing bottom and extending upward into said apertures of said middle plate, said contact assemblies adapted to selectively form an electrical connection between said electronic component and said circuit substrate, said contact assemblies having upper and lower portions, said lower portion press fit into said apertures and fixed to a reflowable solder ball; said lower portion having first and second portions, said second portion having a conical shape tapering into said reflowable solder ball, said conical shape formed by straight line segments joining said first portion to a bottom surface of said second portion, wherein said contact assemblies are sealingly press-fitted into said apertures of said housing bottom;

said reflowable solder ball fixed to each of said contact assemblies for forming said electrical connection between said electronic component and said circuit substrate;

whereby said press-fit seal prevents reflowing solder to wick up said contact assemblies during reflow.

2. The socket of claim 1, wherein said contact assembly upper portion further comprises a wiping arm, said middle plate urging said wiping arm subjecting said contact assembly to a bending moment when said middle plate is in the contacting position, such that said wiping arms are in biased engagement with said contact terminals of said electronic component thereby forming an electrical connection therebetween.

3. A socket for selectively, mechanically and electrically connecting an electronic component to a circuit substrate, said socket comprising:

a housing comprising a top mounting surface and bottom mounting surface, said top mounting surface having a plurality of apertures therein arranged to correspond with a plurality of contact terminals extending from said electronic component, and said bottom mounting surface having a plurality of apertures arrange to correspond with electrically conductive contacts of said circuit substrate;

a cavity formed by said housing between said top mounting surface and said bottom mounting surface;

a middle plate disposed in said cavity, said middle plate selectively movable relative to the housing between a contact and non-contact position, said plate having a plurality of apertures arranged to correspond with and receive said plurality of contact terminals of said electronic component;

a plurality of contact assemblies disposed in said apertures of said housing bottom and extending upward into said apertures of said middle plate, said contact assemblies adapted to selectively form an electrical connection between said electronic component and said circuit substrate wherein said contact assemblies are sealingly press-fitted into said apertures of said housing bottom, said contact assemblies having upper and lower portions, said lower portion press fit into said apertures and fixed to said reflowable solder ball; said lower portion having a second portion having a generally conical shape tapering into said reflowable solder ball, said press-fit seal including an axial slot in said lower portion of said contact assembly, said axial slot fully closing when said contact assembly is inserted into said aperture;

a reflowable solder ball fixed to each of said contact assemblies for forming said electrical connection between said electronic component and said circuit substrate;

whereby said press-fit seal prevents reflowing solder to wick up said contact assemblies during reflow.

4. A contact assembly for a connector having a plurality of contact receiving apertures and an actuating plate, said contact assembly comprising:

said contact assembly adapted for press-fit insertion in said contact receiving apertures of said housing bottom and extending upward into said apertures of said middle plate, said contact assemblies, adapted to selectively form an electrical connection between said electronic component and said circuit substrate wherein said contact assemblies are sealingly press-fitted into said apertures of said housing bottom;

said contact assembly having a conical end including a longitudinal slot for press-fitting into said aperture and coming to a tapered end adapted for attaching a reflowable solder ball thereto.

5. A contact assembly comprising:

an upper portion;

a lower portion, said lower portion further comprising:
　a first portion with a longitudinal cross-section corresponding to the shape of an aperture in which said contact assembly is to be mounted;
　a second substantially conical portion adapted for receiving a reflowable solder ball thereon;

said lower portion further comprising an axial slot adapted for forming both a press-fit and sealed mounts between said aperture and said contact assembly.

6. The contact assembly according to claim 5 wherein said upper portion further comprises a wiping portion, said wiping portion is curved as said wiping portion extends from said lower portion so that a wiping portion cross section includes at least one arc.

7. The contact assembly according to claim 5, wherein said contact assembly is made from a sheet of conductive material by stamping a flattened unformed contact assembly from said sheet and bending the flattened unformed contact assembly to form said lower portion and said wiping arm.

* * * * *

UNITED STATES PATENT AND TRADEMARK OFFICE
CERTIFICATE OF CORRECTION

PATENT NO.     : 6,644,985 B2
DATED          : November 11, 2003
INVENTOR(S)    : John W. Wilson et al.

It is certified that error appears in the above-identified patent and that said Letters Patent is hereby corrected as shown below:

Column 13,
Line 39, the second occurrence of the word "said" should be typed as the word -- a --.

Column 14,
Line 1, The word "a" should be typed as the word -- said -- .

Signed and Sealed this

Twenty-seventh Day of July, 2004

JON W. DUDAS
*Acting Director of the United States Patent and Trademark Office*